(12) United States Patent
Mehrotra et al.

(10) Patent No.: US 7,344,929 B2
(45) Date of Patent: Mar. 18, 2008

(54) METHOD FOR MANUFACTURING AN INTEGRATED CIRCUIT USING A CAPPING LAYER HAVING A DEGREE OF REFLECTIVITY

(75) Inventors: Manoj Mehrotra, Plano, TX (US); Amitabh Jain, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 296 days.

(21) Appl. No.: 11/034,791

(22) Filed: Jan. 13, 2005

(65) Prior Publication Data

US 2006/0154475 A1    Jul. 13, 2006

(51) Int. Cl.
*H01L 21/00* (2006.01)
(52) U.S. Cl. ............ 438/154; 438/199; 438/795; 438/DIG. 902; 257/E21.324; 257/E21.632
(58) Field of Classification Search .......... 438/154, 438/199, 795, 902; 257/E21.324, E21.632
See application file for complete search history.

(56) References Cited

U.S. PATENT DOCUMENTS

| 5,139,971 | A | * | 8/1992 | Giridhar et al. | ............ 438/622 |
| 5,523,262 | A | * | 6/1996 | Fair et al. | ............ 438/799 |
| 6,790,714 | B2 | * | 9/2004 | Hirano et al. | ............ 438/149 |
| 7,084,052 | B2 | * | 8/2006 | Hirano et al. | ............ 438/530 |
| 7,189,624 | B2 | * | 3/2007 | Ito | ............ 438/308 |

* cited by examiner

*Primary Examiner*—Michael Lebentritt
*Assistant Examiner*—Stanetta Isaac
(74) *Attorney, Agent, or Firm*—Jacqueline J. Garner; W. James Brady, III; Frederick J. Telecky, Jr.

(57) ABSTRACT

The present invention provides a method for manufacturing a semiconductor device and a method for manufacturing an integrated circuit. The method for manufacturing the semiconductor device, among other steps, includes forming a capping layer (210) over a transistor device having source/drain regions (150, 155) located over a substrate (110), the capping layer (210) having a degree of reflectivity, and annealing the transistor device through the capping layer (210) using photons (310), the annealing of the transistor device affected by the degree of reflectivity.

24 Claims, 5 Drawing Sheets

METHOD FOR MANUFACTURING AN INTEGRATED CIRCUIT USING A CAPPING LAYER HAVING A DEGREE OF REFLECTIVITY

TECHNICAL FIELD OF THE INVENTION

The present invention is directed, in general, to a method for manufacturing an integrated circuit and, more specifically, to a method for manufacturing an integrated circuit using a capping layer having a degree of reflectivity.

BACKGROUND OF THE INVENTION

Metal-oxide-semiconductor (MOS) transistors provide a basic building block that is employed in a wide variety of integrated circuit applications. The increase in MOS transistor densities, due to their shrinking footprint, have allowed their use in a broad spectrum of integrated circuits and systems. Many current integrated circuit applications employ a multitude of different MOS transistor types. For example, in addition to the core type of MOS transistors found on the substrate of a given integrated circuit, other high performance and low performance types may also be found on the substrate of the integrated circuit. Present MOS transistor design rules often employ multiple, if not varying, threshold voltages to trade-off the power versus performance for the different types of MOS transistors found in a given integrated circuit.

Currently, the different threshold voltages are achieved using a collection of additional reticles and associated etch/implant processes designed to vary one of the many parameters tied directly to a transistors threshold voltage. For example, the collection of additional reticles and associated etch/implant processes are designed to adjust, among others, a MOS transistors' gate length, gate oxide thickness and type, source/drain dopant profile and channel, to tailor a MOS transistors' threshold voltage. In addition to tailoring the threshold voltage for the different types of MOS transistors, the n-type and p-type MOS transistors of a given type in a standard complementary MOS transistor flow must also be tailored. Unfortunately, the different threshold voltages required in a given integrated circuit, whether complimentary MOS transistors of the same type or different types of MOS transistors, are often difficult and costly to achieve.

Accordingly, what is needed in the art is a method for easily and inexpensively manufacturing MOS transistors having varying threshold voltages without experiencing the drawbacks of the prior art methods.

SUMMARY OF THE INVENTION

To address the above-discussed deficiencies of the prior art, the present invention provides a method for manufacturing a semiconductor device and a method for manufacturing an integrated circuit. The method for manufacturing the semiconductor device, among other steps, includes forming a capping layer over a transistor device having source/drain regions located over a substrate, the capping layer having a degree of reflectivity, and annealing the transistor device through the capping layer using photons, the annealing of the transistor device affected by the degree of reflectivity.

The present invention further includes a method for manufacturing an integrated circuit. The method for manufacturing the integrated circuit, without being limited to such, may include: 1) forming at least first and second transistor devices over a substrate, each of the first and second transistor devices having source/drain regions in the substrate, 2) forming a capping layer over at least the first transistor device, the capping layer having a degree of reflectivity, 3) annealing the first and second transistor devices using photons, the degree of reflectivity of the capping layer causing an annealing temperature of the first transistor device to be lower than an annealing temperature of the second transistor device, and 4) forming interconnects within dielectric layers located over the first and second transistor devices to form an operational integrated circuit.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIGURES. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

The present invention is based, at least in part, on the unique recognition that an anneal temperature for a given transistor device may be tailored by forming a capping layer having a degree of reflectivity over a transistor device prior to the transistor device being subjected to a photonic anneal source. The degree of reflectivity, as one would expect, affects the amount of photons reaching the point of interest of the transistor device, and thus the anneal temperature of that device. For example, for a given photonic energy source, as the degree of reflectivity of the capping layer increases, the annealing temperature decreases. On the other hand, as the degree of reflectivity of the capping layer decreases, the annealing temperature increases. The degree of reflectivity can be adjusted by changing the thickness of the capping layer, material composition of the capping layer, wavelength of the photonic anneal source, or any collection thereof, among others. It is currently believed that a temperature differential of more than about 30 degrees may be easily achieved by adjusting the degree of reflectivity of the capping layer.

Beyond the aforementioned recognition, the present invention has acknowledged that by forming a capping layer having different degrees of reflectivity over different transistor devices, the anneal temperatures for the different transistor devices may be somewhat tailored. This unique method for tailoring the anneal temperature of the transistor devices may thus be easily used to individually adjust the threshold voltages of the transistor devices. For instance, the different anneal temperatures may be used to adjust the dopant profiles in the source/drain regions and the junctions associated therewith, the gate electrodes and other regions of the transistor devices. Thus, the present invention accommodates the desire to easily and inexpensively manufacturing MOS transistors having varying threshold voltages, as required by integrated circuits needing core transistor devices, high performance transistor devices and low performance transistor devices on the same substrate.

Figure 1:
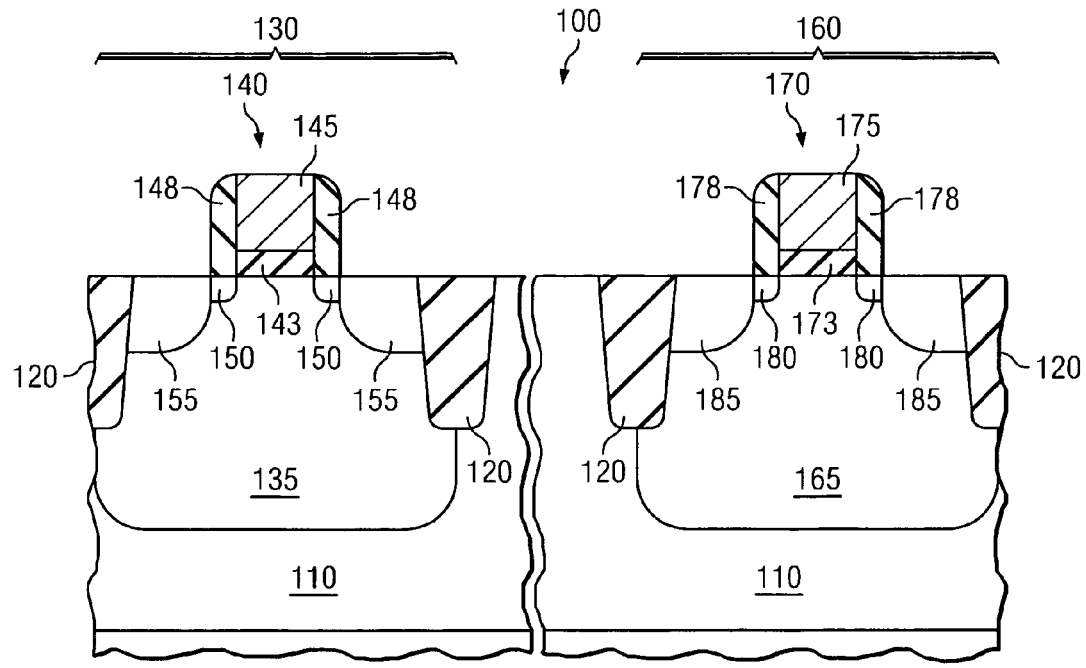
FIG. 1 illustrates a cross-sectional view of a partially completed semiconductor device at an initial stage of manufacture.
Figure 2A:
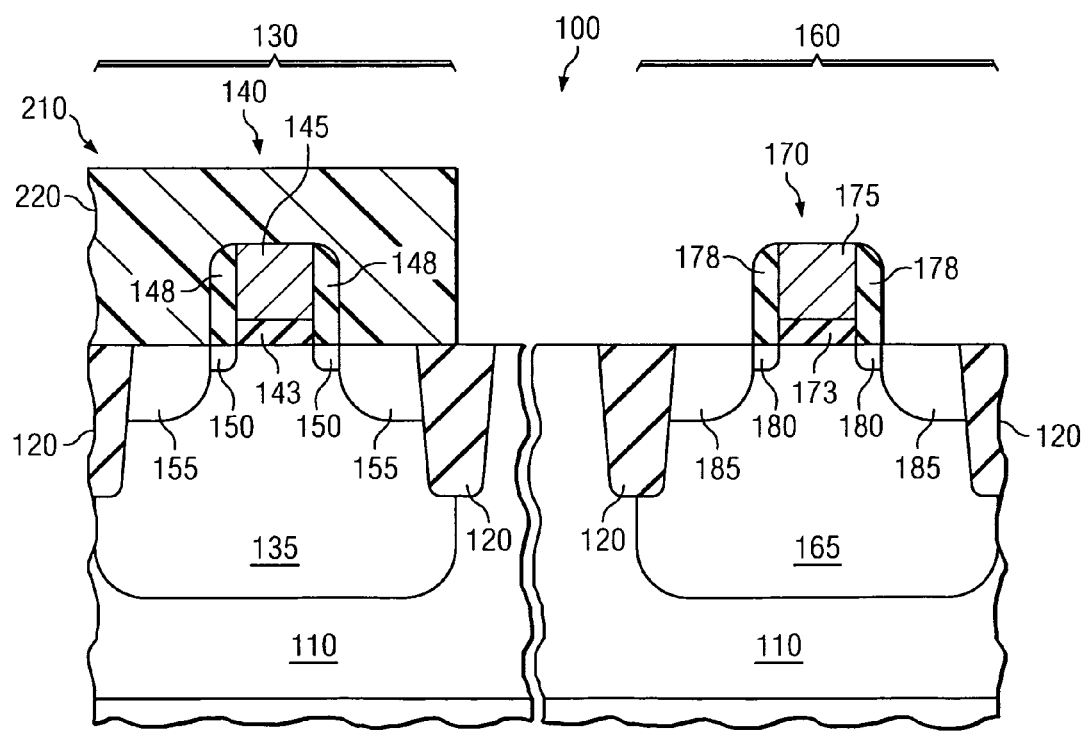
FIGS. 2A-2D illustrate cross-sectional views of the partially completed semiconductor device illustrated in FIG. 1 after forming embodiments of a capping layer thereover.
Figure 2B:
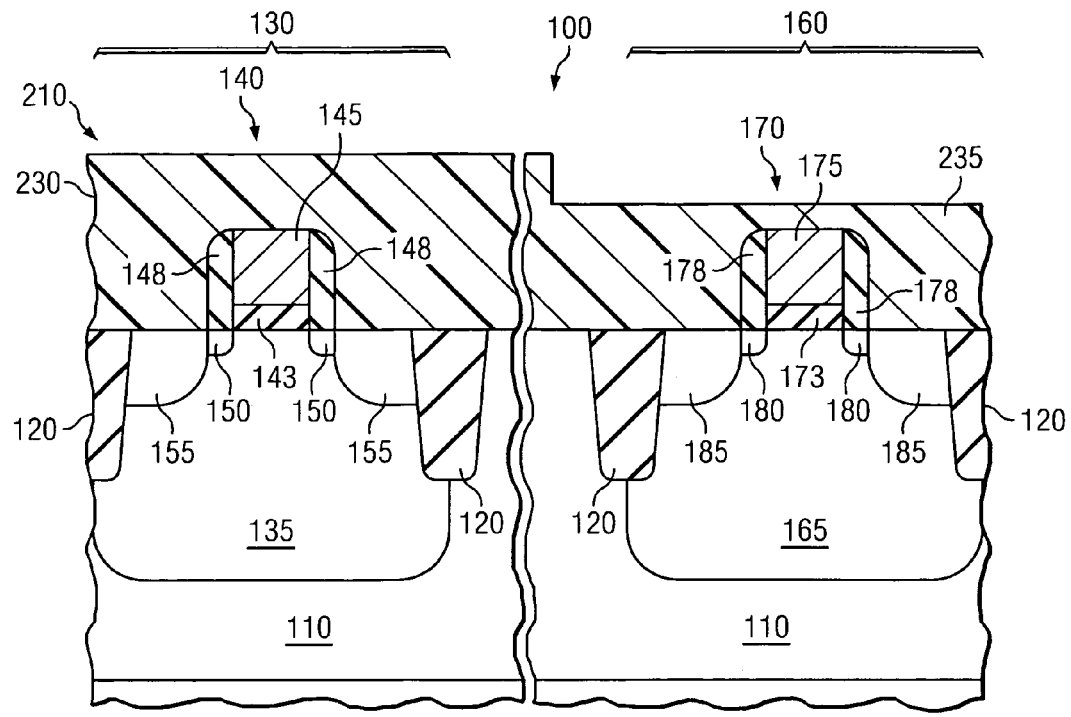
Figure 2C:
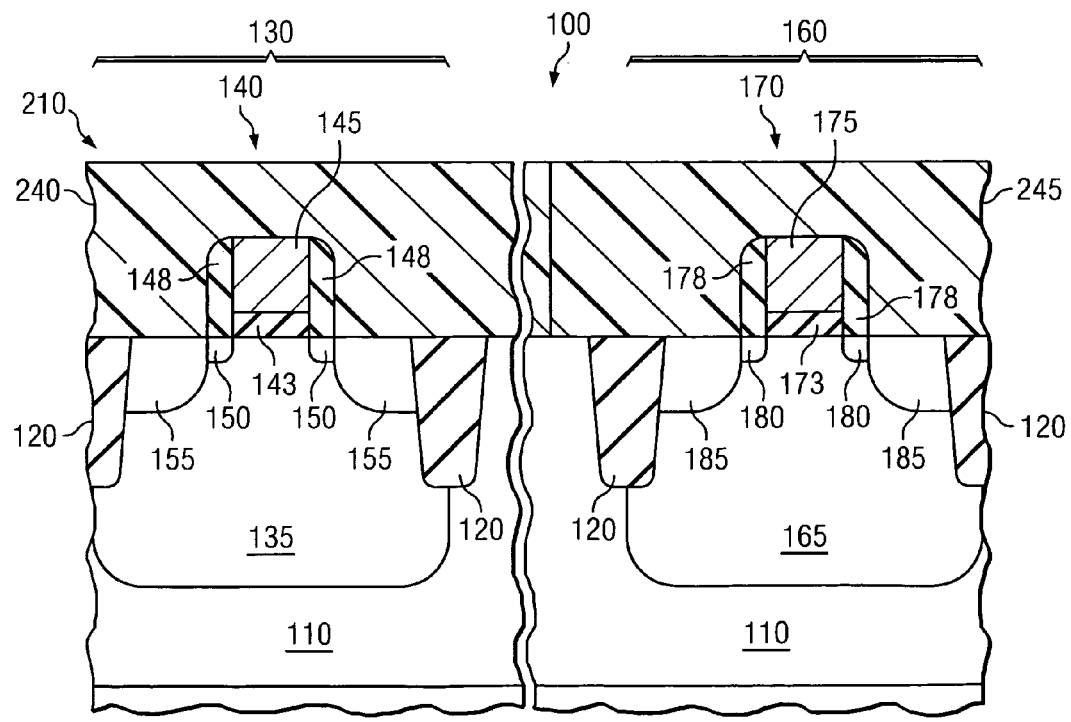
Figure 2D:
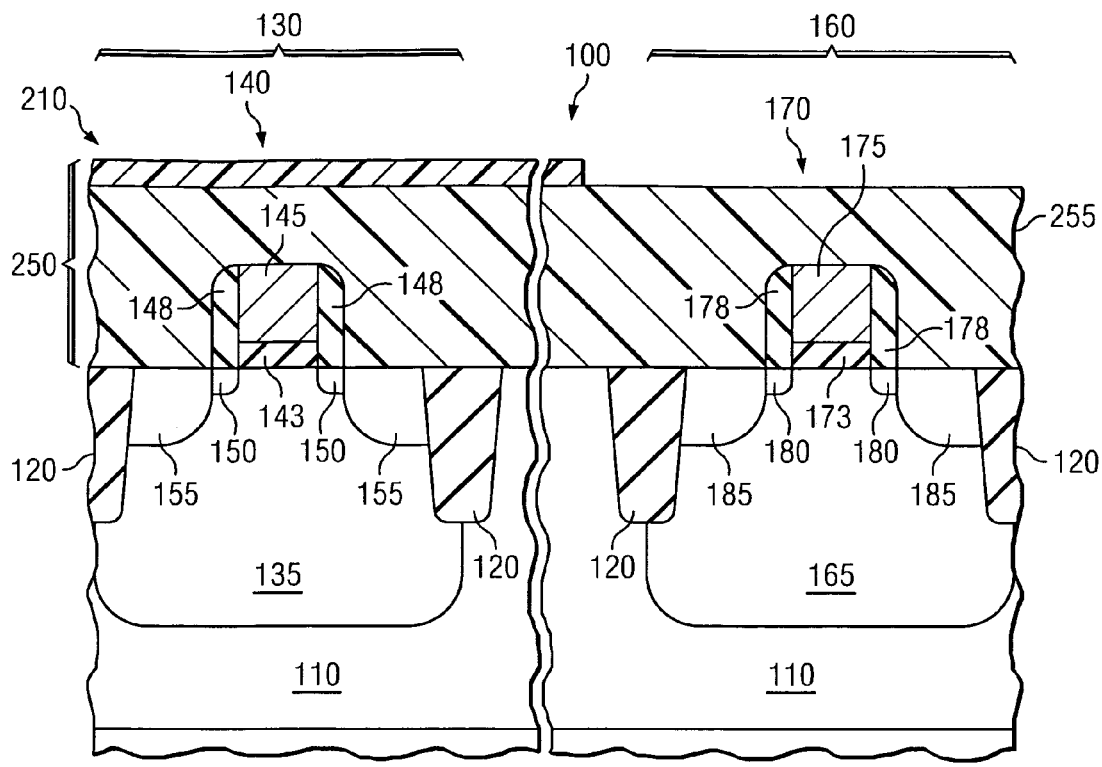
Figure 3:
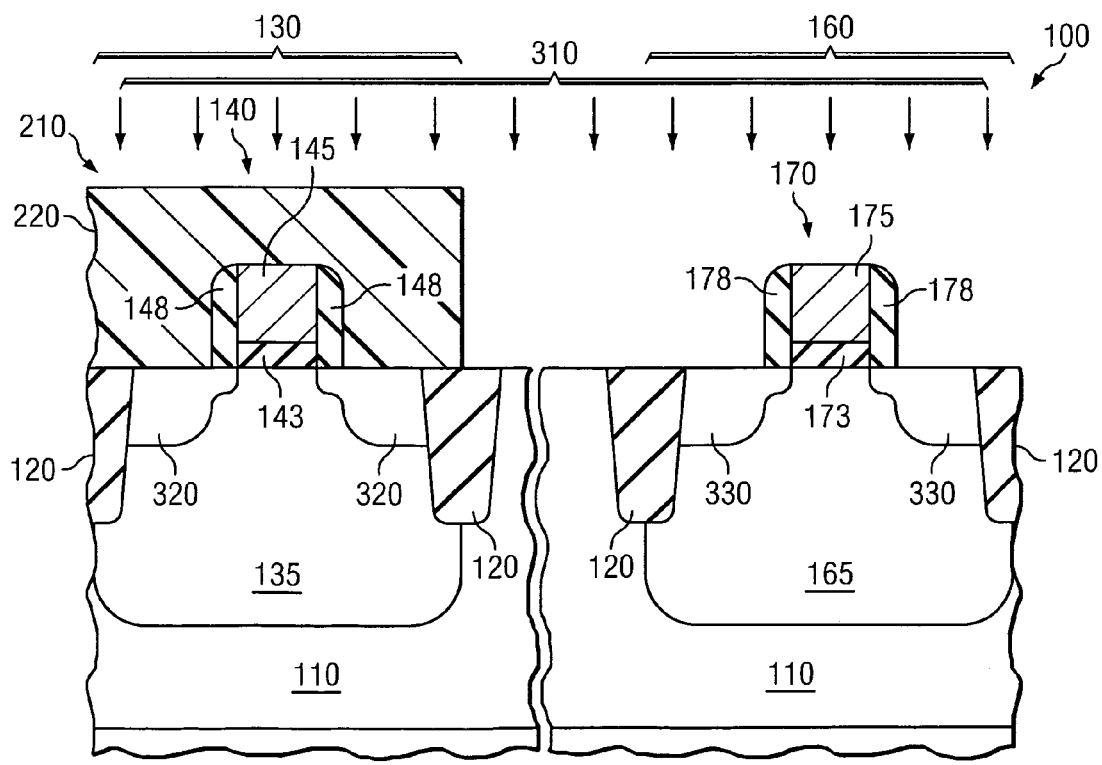
FIG. 3 illustrates a cross-sectional view of the partially completed semiconductor device illustrated in FIG. 2A, as it is being annealed using photons.

Turning now to FIGS. 1-3 illustrated are cross-sectional views of detailed manufacturing steps depicting how one might manufacture a semiconductor device according to the principles of the present invention. FIG. 1 illustrates a cross-sectional view of a partially completed semiconductor device 100. The partially completed semiconductor device 100 includes a substrate 110. The substrate 110 may, in an exemplary embodiment, be any layer located in the partially completed semiconductor device 100, including a wafer itself or a layer located above the wafer (e.g., epitaxial layer). In the embodiment illustrated in FIG. 1, the substrate 110 is a P-type semiconductor substrate; however, one skilled in the art understands that the substrate 110 could be an N-type substrate, without departing from the scope of the present invention.

The embodiment of the partially completed semiconductor device 100 illustrated in FIG. 1 includes a first device region 130 and a second device region 160. The two device regions 130 and 160 may comprise a number of different devices while staying within the scope of the present invention. In most situations, the resulting devices for the two device regions 130 and 160 will have different operational threshold voltages. For example, the first device region 130 might comprise a device having a given set of operating characteristics (e.g., power consumption, performance, etc.) and the second device region 160 might comprise a device having a different set of operating characteristics. In this embodiment, such as the embodiment depicted and discussed with respect to FIGS. 1-3, the first device region 130 might comprise a lower performance device having a high threshold voltage and the second device region 160 might comprise a higher performance device having a low threshold voltage. Other embodiments exist, however, including an alternative embodiment wherein the first device region comprises a PMOS device and the second device region 160 comprises an NMOS device, or vice versa, such as used in a CMOS configuration.

Located within the substrate 110 in the embodiment shown in FIG. 1 are shallow trench isolation regions 120. The shallow trench isolation regions 120 are conventional structures formed using conventional techniques and are used to isolate the first device region 130 and second device region 160 from one another, as well as other devices formed on the substrate 110.

In the illustrative embodiment of FIG. 1, formed within the substrate 110, and within the first device region 130, is well region 135. Conventionally located over the well region 135 and on the substrate 110 in the first device region 130 is a gate structure 140, including a conventional gate oxide 143, conventional gate electrode 145 and conventional gate sidewall spacers 148. Located in the substrate 110 below the gate structure 140 are lightly doped source/drain extension implants 150 and heavily doped source/drain regions 155.

Similarly, formed within the substrate 110 of the second device region 160, is well region 165. Conventionally located over the well region 165 and on the substrate 110 in the second device region 160 is a gate structure 170, including a conventional gate oxide 173, conventional gate electrode 175 and conventional gate sidewall spacers 178. Located in the substrate 110 below the gate structure 170 are lightly doped source/drain extension implants 180 and heavily doped source/drain regions 185. The features located within the first device region 130 and second device region 160 at this stage of manufacture are conventional, and are often similar to one another. Accordingly, one skilled in the art would understand the steps required to manufacture a semiconductor device to the shown stage of manufacture. For this reason, no further detail is warranted at this time.

Turning now to FIG. 2A, illustrated is a cross-sectional view of the partially completed semiconductor device 100 illustrated in FIG. 1 after forming a capping layer 210 over the substrate 110. As required by the present invention, the capping layer 210 has a given degree of reflectivity. The degree of reflectivity, as one would expect, is at least partially a function of the material composition and thickness of the capping layer 210. As discussed further below, the degree of reflectivity is also a function of the wavelength of the incoming photonic source. Accordingly, adjusting one or all of the material composition, material thickness, and wavelength can optimize the degree of reflectivity.

The capping layer 210 may comprise a variety of different materials and thicknesses to accomplish the desired degree of reflectivity, while staying within the scope of the present invention. For instance, one embodiment of the invention has the capping layer comprising a nitride, however, other embodiments exist where the capping layer 210 comprises an oxide, oxynitride or any other material having a suitable degree of reflectivity. Additionally, the capping layer 210 may comprise a stack of different materials, as discussed later on.

The capping layer 210, in the embodiment illustrated in FIG. 2A, includes a capping layer portion 220 that is formed over the first device region 130 and not the second device region 160. Accordingly, the second device region 160 is unprotected by the capping layer portion 220, and thus exposed. Those skilled in the art understand the processes that might be used to place the capping layer portion 220 over the first device region 130 and not the second device region 160. For instance, those skilled in the art understand that a conventional photolithography/etch process could be used to form the capping layer portion 220.

Turning briefly to FIG. 2B, illustrated is an alternative embodiment of the capping layer 210 illustrated in FIG. 2A. The capping layer 210 of FIG. 2B includes a first thicker portion 230 located over the first device region 130 and a second thinner portion 235 located over the second device region 160. As the degree of reflectivity of the first thicker portion 230 and second thinner portion 235 are strongly related to the thickness of the respective layers, they have different degrees of reflectivity. In the given embodiment of FIG. 2B, the first thicker portion 230 has a higher degree of reflectivity and the second thinner portion has a lower degree of reflectivity. Accordingly, during annealing the first and second device regions 130, 160 using photons, as discussed below with respect to FIG. 3, the first device region 130 under the first thicker portion 230 will be subjected to a lower temperature anneal. Similarly, the second device region 160 under the second thinner portion 235 will be subjected to a higher temperature anneal. This scenario assumes that the first and second portions 230, 235 comprise the same material, as well as that the same photon source is used to anneal both the first and second portions 230, 235. Those skilled in the art understand the processes that might be used to define the first and second portions 230, 235, including conventional photolithography/etch steps.

Turning briefly to FIG. 2C, illustrated is an alternative embodiment of the capping layer 210 illustrated in FIGS. 2A and 2B. The capping layer 210 of FIG. 2C includes a first material portion 240 located over the first device region 130 and a second material portion 245 located over the second device region 160. The first and second material portions 240, 245, are chosen such that each has a different degree of reflectivity from one another. For example, while the first and second material portions 240, 245 may have similar if not identical thicknesses, the material composition of the first and second material portions 240, 245, cause their degree of reflectivities to be different. Similar to the embodiments of FIGS. 2A and 2B discussed above, one skilled in the art would easily understand the steps required to form the embodiment of FIG. 2C.

Turning briefly to FIG. 2D, illustrated is an alternative embodiment of the capping layer 210 illustrated in FIGS. 2A, 2B and 2C. The capping layer 210 of FIG. 2D includes a first stacked portion 250 located over the first device region 130 and a second non-stacked portion 255 located over the second device region 160. The degree of reflectivity of the first stacked portion 250 is increased, at least as compared to the second non-stacked portion 255, because of the second material layer thereon. In the given embodiment of FIG. 2D, a single layer of material is located over both the first device region 130 and the second device region 160, and a second material layer is patterned over the first device region 130, resulting in the structure shown. Similar to the embodiments of FIGS. 2A, 2B and 2C discussed above, one skilled in the art would easily understand the steps required to form the embodiment of FIG. 2D.

FIGS. 2A-2D illustrate but a few embodiments of a capping layer 210 manufactured in accordance with the principles of the present invention. For example, any conceivable combination of the embodiments illustrated in FIGS. 2A-2D could also be used. Additionally, two or more different layers could be stacked upon one another to create the ideal degree of reflectivity. Nevertheless, for the inventive aspects of the present invention to work best, the degree of reflectivity of the medium located between the photonic anneal source and the first and second device regions 130, 160, whether it be a layer(s) of material or a fluid, should be different.

Turning now to FIG. 3, illustrated is a cross-sectional view of the partially completed semiconductor device 100 illustrated in FIG. 2A, as it is being annealing using photons 310. The photons 310 may be provided using a photonic anneal source, such as a laser anneal source. In an exemplary embodiment, the photons 310 are monochromatic in nature.

Unique to the present invention, the capping layer 210 located over the first device region 130 reflects at least a portion of the photons 310 being projected there towards as they pass through a lattice structure of the capping layer 210. On the other hand, the capping layer 210 is not located over the second device region 160 in the embodiment shown, and thus substantially all of the photons 310 from the photonic anneal source reach the second device region 160. Accordingly, the anneal temperature of the second device region 160 is greater than the anneal temperature of the first device region 130. What results are source/drain regions 320 in the first device region 130 and different source/drain regions 330 in the second device region 160. Thus, everything else being the same, the threshold voltage of the first device region 130 is different than the threshold voltage of the second device region 160.

Figure 4:
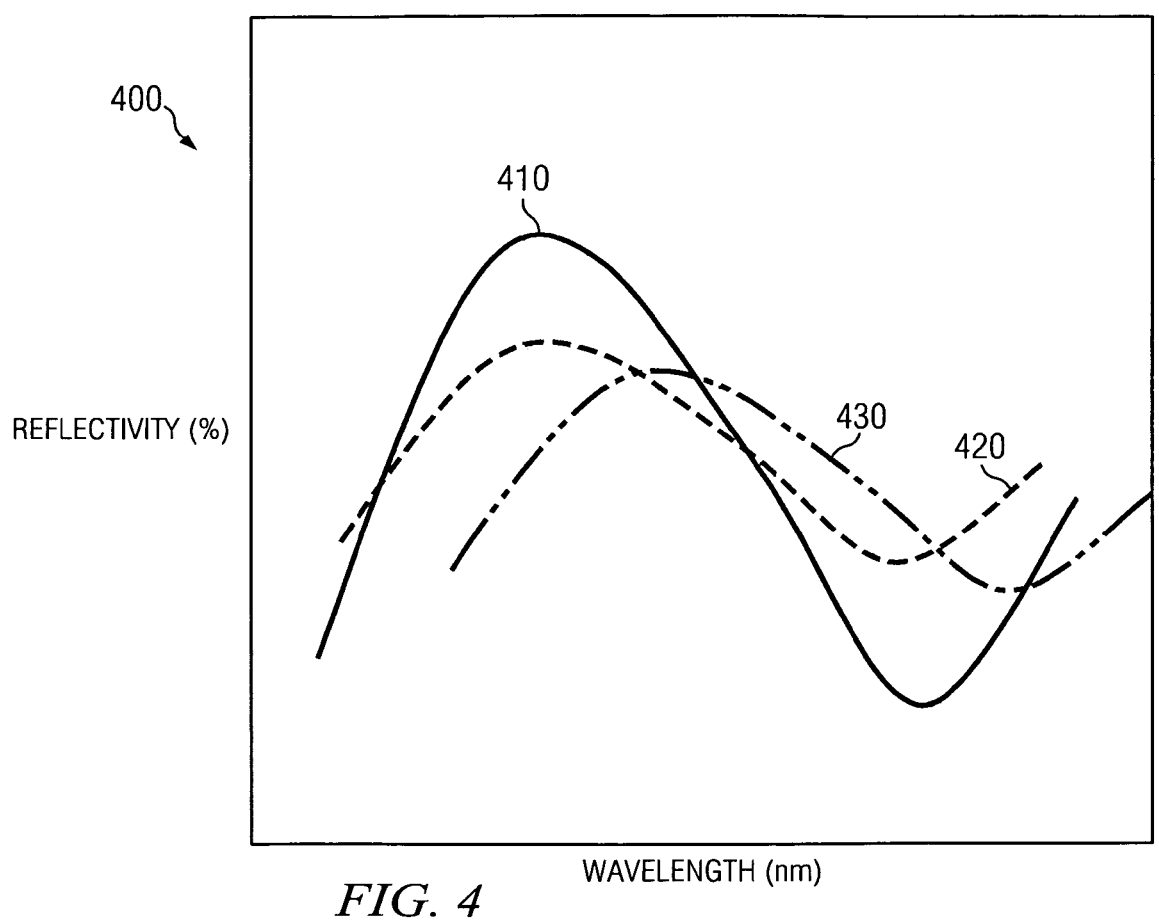
FIG. 4 illustrates a graph comparing reflectivity versus wavelength for three different capping layers.

Turning briefly to FIG. 4, illustrated is a graph 400 comparing reflectivity versus wavelength for three different capping layers 410, 420, 430. In the embodiment of FIG. 4, capping layer 410 comprises a different material than capping layer 420, however, they have the same thickness. As is obvious, the different materials of capping layer 410 and 420, for a given wavelength, typically have different reflectivities. Capping layer 430, on the other hand, comprises the same material as capping layer 420, however, it has a different thickness. Again, the different thicknesses of the capping layers 420 and 430, for a given wavelength, also typically have different reflectivities. Graph 400 further illustrates that the wavelength of the photonic annealing source may also be adjusted to achieve a certain reflectivity, and thus annealing temperature. The embodiments shown in FIGS. 1-3 depict that the first and second device regions 130, 160 are located directly adjacent one another. Nevertheless, certain embodiments exist where a degree of space separates the first and second device regions 130, 160. For instance, because heat can not be entirely localized, the heat from the anneal of the first device region 130 and the heat from the second device region 160 may affect one another if the devices are too close to one another. For this reason, certain embodiments exist where the first and second device regions 130, 160, are 100 μm or more from each other. This distance obviously depends on a number of different properties, including the laser dwell time, wavelength, substrate/semiconductor properties (epi/bulk/other) and other tool set-up/limitations, among several other factors.

Figure 5:
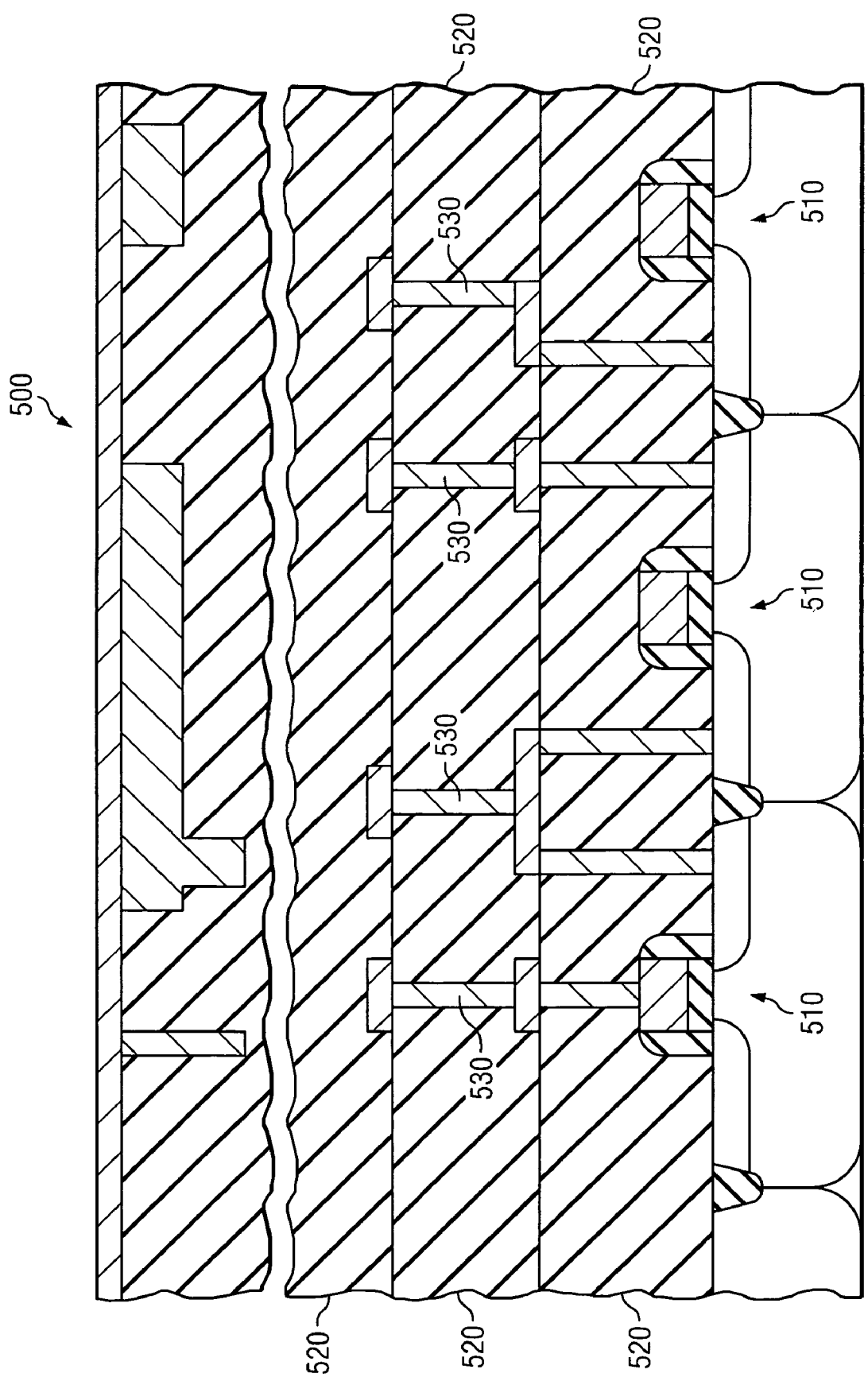
FIG. 5 illustrates a sectional view of a conventional integrated circuit (IC) incorporating semiconductor devices constructed according to the principles of the present invention.

Referring finally to FIG. 5, illustrated is a cross-sectional view of a conventional integrated circuit (IC) 500 incorporating semiconductor devices 510 constructed according to the principles of the present invention. The IC 500 may include devices, such as transistors used to form CMOS devices, BiCMOS devices, Bipolar devices, or other types of devices. The IC 500 may further include passive devices, such as inductors or resistors, or it may also include optical devices or optoelectronic devices. Those skilled in the art are familiar with these various types of devices and their manufacture. In the particular embodiment illustrated in FIG. 5, the IC 500 includes the semiconductor devices 510 having dielectric layers 520 located thereover. Additionally, interconnect structures 530 are located within the dielectric layers 520 to interconnect various devices, thus, forming the operational integrated circuit 500.

Although the present invention has been described in detail, those skilled in the art should understand that they can make various changes, substitutions and alterations herein without departing from the spirit and scope of the invention in its broadest form.

What is claimed is:

1. A method for manufacturing a semiconductor device, comprising:
   forming a capping layer over a first transistor device having source/drain regions located over a substrate, the capping layer having a degree of reflectivity;
   annealing the first transistor device through the capping layer using photons, the annealing of the first transistor device affected by the degree of reflectivity such that during the anneal, an anneal temperature at the first transistor device is different that an anneal temperature at a second transistor device located on the substrate.

2. The method as recited in claim 1 wherein annealing the transistor device through the capping layer includes annealing the transistor device through a lattice structure of the capping layer and not through an opening in the capping layer.

3. The method as recited in claim 1 wherein the degree of reflectivity governs a temperature of the anneal.

4. The method as recited in claim 3 wherein a higher degree of reflectivity causes the temperature of the anneal to be lower and a lower degree of reflectivity causes the temperature of the anneal to be higher.

5. The method as recited in claim 1 wherein forming the capping layer includes forming the capping layer over the first transistor device and the second transistor device, a portion of the capping layer located over the first transistor device having the degree of reflectivity and a portion of the capping layer located over the second transistor device having a different degree of reflectivity.

6. The method as recited in claim 5 wherein the degree of reflectivity and the different degree of reflectivity are substantially controlled by a thickness of the capping layer located over the first transistor device and a thickness of the capping layer located over the second transistor device, respectively.

7. The method as recited in claim 6 wherein the thickness of the capping layer located over the first transistor device is greater than the thickness of the capping layer located over the second transistor device, thereby causing the degree of reflectivity to be greater than the different degree of reflectivity.

8. The method as recited in claim 7 wherein the degree of reflectivity and the different degree of reflectivity cause a temperature of the anneal of the first transistor device to be lower than a temperature of the anneal of the second transistor device.

9. The method as recited in claim 5 wherein the degree of reflectivity and the different degree of reflectivity are substantially controlled by a material composition of the capping layer located over the first transistor device and a material composition of the capping layer located over the second transistor device.

10. The method as recited in claim 9 wherein the material composition of the capping layer located over the first transistor device and the material composition of the capping layer located over the second transistor device causes the degree of reflectivity to be greater than the different degree of reflectivity.

11. The method as recited in claim 10 wherein the degree of reflectivity and the different degree of reflectivity cause a temperature of the anneal of the first transistor device to be lower than a temperature of the anneal of the second transistor device.

12. The method as recited in claim 1 wherein the capping layer is not located over the second transistor device, the degree of reflectivity of the capping layer causing a temperature of the anneal of the first transistor device to be lower than a temperature of the anneal of the second transistor device.

13. The method as recited in claim 1 wherein annealing the transistor device through the capping layer using photons includes annealing the transistor device through the capping layer using a monochromatic energy source.

14. A method for manufacturing an integrated circuit, comprising:
    forming at least first and second transistor devices over a substrate, each of the first and second transistor devices having source/drain regions in the substrate;
    forming a capping layer over at least the first transistor device, the capping layer having a degree of reflectivity;
    annealing the first and second transistor devices using photons, the degree of reflectivity of the capping layer causing an annealing temperature of the first transistor device to be lower than an annealing temperature of the second transistor device; and
    forming interconnects within dielectric layers located over the first and second transistor devices to form an operational integrated circuit.

15. The method as recited in claim 14 wherein annealing the first transistor device through the capping layer includes annealing the first transistor device through a lattice structure of the capping layer and not through an opening in the capping layer.

16. The method as recited in claim 14 wherein a higher degree of reflectivity causes the annealing temperature of the first transistor device to be lower and a lower degree of reflectivity causes the annealing temperature of the first transistor device to be higher.

17. The method as recited in claim 14 wherein forming the capping layer includes forming the capping layer over at least the first transistor device and the second transistor device, a portion of the capping layer located over the first transistor device having the degree of reflectivity and a portion of the capping layer located over the second transistor device having a different degree of reflectivity.

18. The method as recited in claim 17 wherein the degree of reflectivity and the different degree of reflectivity are substantially controlled by a thickness of the capping layer located over the first transistor device and a thickness of the capping layer located over the second transistor device, respectively.

19. The method as recited in claim 18 wherein the thickness of the capping layer located over the first transistor device is greater than the thickness of the capping layer located over the second transistor device, thereby causing the degree of reflectivity to be greater than the different degree of reflectivity.

20. The method as recited in claim 17 wherein the degree of reflectivity and the different degree of reflectivity are substantially controlled by a material composition of the capping layer located over the first transistor device and a material composition of the capping layer located over the second transistor device.

21. The method as recited in claim 20 wherein the material composition of the capping layer located over the first transistor device and the material composition of the capping layer located over the second transistor device causes the degree of reflectivity to be greater than the different degree of reflectivity.

22. The method as recited in claim 14 wherein the capping layer is not located over the second transistor device, the degree of reflectivity of the capping layer causing the annealing temperature of the first transistor device to be lower than the annealing temperature of the second transistor device.

23. The method as recited in claim 14 wherein the first transistor device and the second transistor device are different types of devices.

24. The method as recited in claim 14 wherein the first transistor device and the second transistor device are located at least about 100 µm apart.

* * * * *